United States Patent
Wu

(10) Patent No.: US 9,256,087 B2
(45) Date of Patent: Feb. 9, 2016

(54) COLOR CAST COMPENSATION METHOD AND SYSTEM FOR LIQUID CRYSTAL DISPLAY PANEL

(71) Applicant: Shenzhen China Star Optoelectronics Technology Co., Ltd., Shenzhen, Guangdong (CN)

(72) Inventor: Yu Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 121 days.

(21) Appl. No.: 14/239,337

(22) PCT Filed: Jan. 6, 2014

(86) PCT No.: PCT/CN2014/070173
§ 371 (c)(1),
(2) Date: Feb. 18, 2014

(87) PCT Pub. No.: WO2015/089920
PCT Pub. Date: Jun. 25, 2015

(65) Prior Publication Data
US 2015/0177546 A1    Jun. 25, 2015

(30) Foreign Application Priority Data

Dec. 20, 2013  (CN) .......................... 2013 1 0708659

(51) Int. Cl.
*G06F 17/50*    (2006.01)
*G02F 1/133*    (2006.01)
*G09G 3/36*    (2006.01)
*G02F 1/1368*    (2006.01)

(52) U.S. Cl.
CPC .......... *G02F 1/13306* (2013.01); *G02F 1/1368* (2013.01); *G06F 17/5009* (2013.01); *G06F 17/5072* (2013.01); *G09G 3/36* (2013.01)

(58) Field of Classification Search
CPC ............ G09G 3/36; G06F 3/041; G06F 3/045
USPC ......................... 716/122, 139; 345/84, 87–93
See application file for complete search history.

(56) References Cited

U.S. PATENT DOCUMENTS

| | | | |
|---|---|---|---|
| 7,123,234 B2* | 10/2006 | Moon et al. | 345/98 |
| 2006/0114216 A1* | 6/2006 | Shim | 345/100 |
| 2011/0157107 A1* | 6/2011 | Jo | G02F 1/136286 345/204 |
| 2013/0120344 A1* | 5/2013 | Liao et al. | 345/212 |

* cited by examiner

*Primary Examiner* — Nghia Doan
(74) *Attorney, Agent, or Firm* — Andrew C. Cheng

(57) ABSTRACT

The embodiments of the present invention publishes a color cast compensation method for liquid crystal display panel, which comprises the steps of obtaining a trace impedance of each trace of a plurality of traces in a fan-out-shape and obtaining a correlation curve showing the relationship between the trace impedance and a channel according to the trace impedance; obtaining a curve of a real driving force on an output terminal of the channel according to the correlation curve showing the relationship between the trace impedance and the channel; adjusting a size of a cross-sectional area of a MOS transistor on the output terminal of the channel according to the curve of the real driving force. The embodiment of the present invention further publishes another color cast compensation method for liquid crystal display panel and a color cast compensation system for liquid crystal display panel. The embodiments of the present invention solves the color cast problem appears in the liquid crystal display panel nowadays.

10 Claims, 4 Drawing Sheets

US 9,256,087 B2

COLOR CAST COMPENSATION METHOD AND SYSTEM FOR LIQUID CRYSTAL DISPLAY PANEL

CROSS REFERENCE TO RELATED APPLICATIONS

This application claims priority to Chinese Application Serial No. 201310708359.X filed Dec. 20, 2013, named as "Color Cast Compensation Method and System for Liquid Crystal Display Panel", content of which is incorporated herein by reference.

FIELD OF THE INVENTION

The present invention relates to display technique, and more particularly to a color cast compensation method and system for liquid crystal display panel.

BACKGROUND OF THE INVENTION

In a conventional Tri-gate LCD panel, the output voltages of each channel on source terminal of each of the transistors are the same, and the driving forces formed therefore are the same as well. To ensure the voltages of each data buses are the same when the transistors are in a solid color mode such that each pixel receives the same electrical potential, impedances of each fan-out shape trace of each channel when unit corresponding to source side of each transistor fans out the fan-out shape trace should be the same theoretically.

However, in a liquid crystal display panel with narrow border, the impedances of the traces is hardly the same because the layout area for the fan-out shape traces in the narrow border is limited. Because the layout distance on two sides of the traces is longer than that on middle of the traces, the impedance usually appears to be small in middle and big on two sides. Accordingly, voltage latency on two sides of the data bus is more serious than that on middle part of the data bus. Once the charging time of the pixel is not enough, the voltage maintained by the pixel cannot reach to an ideal voltage such that the brightness of R, G or B is dimmed. Specifically, when the liquid crystal display panel with narrow border is a single film tri-gate transistor liquid crystal display panel, serious two side color cast appears in color blending grey frame such as R+G, G+B or B+R, and the situations are greenish, bluish or reddish, respectively. It appears to be a vertical color cast block when the liquid crystal display panel is a multiple film tri-gate transistor liquid crystal display panel.

Referring to FIG. 1, which shows the diagram of data curve corresponding to the voltage variation of the channels of the source side of the transistor on middle and both side of the unit, in an example for displaying R+G color blending grey frame in the single film tri-gate transistor liquid crystal display panel, the curve corresponding to the relationship between the output voltage and the channels on three points A, B and C can be obtained. Referring to FIG. 2, the pixel voltage latency in the curves of point B and C in each side is more serious such that the rising time or the falling time of the pixel voltage is slow. When a data source outputs a R+G color blending grey frame (R: 255 grey, G: 255 grey, B: 0 grey), since color R of each pixel on each channel of point B and C cannot be charged to 255 grey and color B of the same pixel cannot be discharged to 0 grey rapidly after the voltage latency caused by the output terminal and the WOA (Wiring On Array), color cast is generated and yellow color is displayed in middle of the displayer while green color is displayed in both side of the displayer.

SUMMARY OF THE INVENTION

The technique problem to be solved by the embodiments of the present invention is to provide a color cast compensation method and system for liquid crystal display panel to solve the color cast problem occurred in liquid crystal display panel existed nowadays.

To solve the technique problem mentioned above, a first technique proposal provided by the present invention is a color cast compensation method for liquid crystal display panel, wherein the color cast compensation method for liquid crystal display panel comprises:

obtaining a trace impedance of each trace of a plurality of traces in a fan-out-shape and obtaining a correlation curve showing the relationship between the trace impedance and a channel according to the trace impedance;

obtaining a curve of a real driving force on an output terminal of the channel according to the correlation curve showing the relationship between the trace impedance and the channel;

adjusting a size of a cross-sectional area of a MOS transistor on the output terminal of the channel according to the curve of the real driving force.

Wherein, the trace impedance of each trace is calculated according to the length and width of each trace.

Wherein, obtaining the curve of the real driving force on the output terminal of the channel according to the correlation curve showing the relationship between the trace impedance and the channel comprises the steps of:

obtaining an output voltage of each trace correlated to the channel according to the correlation curve showing the relationship between the trace impedance and the channel, and presetting a preset driving force of the channel;

determining whether the preset driving force of the channel makes the output voltage of each trace correlated to the channel reach a predetermined pixel charging voltage;

if yes, the real driving force is set to be the same as the preset driving force; otherwise, the preset driving force of the channel where the preset driving force does not make the output voltage of the trace correlated to the channel reach the predetermined pixel charging voltage is adjusted, such that the adjusted preset driving force of the channel makes output voltage of the trace correlated to the channel reach the predetermined pixel charging voltage, and the real driving force is set to be the same as the adjusted preset driving force;

obtaining the curve of the real driving force on the output terminal of the channel according to the real driving force set as above.

Wherein, adjusting the size of the cross-sectional area of the MOS transistor on the output terminal of the channel according to the curve of the real driving force comprises the steps of:

building a channel driving force buffer and adjusting the size of the cross-sectional area of the MOS transistor on the output terminal of the channel according to the curve of the real driving force.

Wherein, the size of the cross-sectional area of the MOS transistor on the output terminal of the channel is proportional to the driving force of the channel.

Wherein, the liquid crystal display panel is a multiple film tri-gate transistor liquid crystal display panel.

To solve the technique problem mentioned above, a second technique proposal provided by the present invention is a color cast compensation method for liquid crystal display panel, wherein the color cast compensation method for liquid crystal display panel comprises:

obtaining a trace impedance of each trace of a plurality of traces in a fan-out-shape and obtaining a correlation curve showing the relationship between the trace impedance and a channel according to the trace impedance;

obtaining an output voltage of each trace correlated to the channel according to the correlation curve showing the relationship between the trace impedance and the channel, and presetting a preset driving force of the channel;

determining whether the preset driving force of the channel makes the output voltage of each trace correlated to the channel reach a predetermined pixel charging voltage;

if yes, the real driving force is set to be the same as the preset driving force; otherwise, the preset driving force of the channel where the preset driving force does not make the output voltage of the trace correlated to the channel reach the predetermined pixel charging voltage is adjusted, such that the adjusted preset driving force of the channel makes output voltage of the trace correlated to the channel reach the predetermined pixel charging voltage, and the real driving force is set to be the same as the adjusted preset driving force;

obtaining a curve of the real driving force on an output terminal of the channel according to the real driving force set as above;

adjusting a size of a cross-sectional area of a MOS transistor on the output terminal of the channel according to the curve of the real driving force.

Wherein, the trace impedance of each trace is calculated according to the length and width of each trace.

Wherein, adjusting the size of the cross-sectional area of the MOS transistor on the output terminal of the channel according to the curve of the real driving force comprises the steps of:

building a channel driving force buffer and adjusting the size of the cross-sectional area of the MOS transistor on the output terminal of the channel according to the curve of the real driving force.

Wherein, the size of the cross-sectional area of the MOS transistor on the output terminal of the channel is proportional to the driving force of the channel.

Wherein, the liquid crystal display panel is a multiple film tri-gate transistor liquid crystal display panel.

To solve the technique problem mentioned above, a third technique proposal provided by the present invention is a color cast compensation system for liquid crystal display panel, wherein the color cast compensation system for liquid crystal display panel comprises: a first obtaining unit, a second obtaining unit and an adjusting unit, wherein, the first obtaining unit is used for obtaining a trace impedance of each trace of a plurality of traces in a fan-out-shape and obtaining a correlation curve showing the relationship between the trace impedance and a channel according to the trace impedance;

the second obtaining unit is used for obtaining a curve of a real driving force on an output terminal of the channel according to the correlation curve showing the relationship between the trace impedance and the channel;

the adjusting unit is used for adjusting a size of a cross-sectional area of a MOS transistor on the output terminal of the channel according to the curve of the real driving force.

Wherein, the trace impedance of each trace is calculated according to the length and width of each trace.

Wherein, the size of the cross-sectional area of the MOS transistor on the output terminal of the channel is proportional to the driving force of the channel.

Wherein, the liquid crystal display panel is a multiple film tri-gate transistor liquid crystal display panel.

Implement the embodiments of the present invention gives the benefit effects as below:

1. By designing driving force of each channel on source side of the transistor to be varied according to charging voltage of each trace for making the output voltage of each trace reach the pixel charging voltage, the problem of color cast caused by insufficient driving force in color blending grey frame displayed in the liquid crystal display panel is solved, and display quality is improved.

2. Because the designed driving force is proportional to the size of the cross-sectional area of the MOS transistor on the output terminal of the channel, the cross-sectional area becomes smaller while the driving force being designed to be smaller, and the cross-sectional area becomes larger while the driving force being designed to be larger. Accordingly, the size of the chip is greatly reduced and the design cost is lowered.

DETAILED DESCRIPTION OF PREFERRED EMBODIMENTS

The present invention will now be described more specifically with reference to the following embodiments.

Refer to the figures from FIG. 3 to FIG. 6, which show the embodiments of the color cast compensation method for liquid crystal display panel provided by the present invention.

Figure 3:
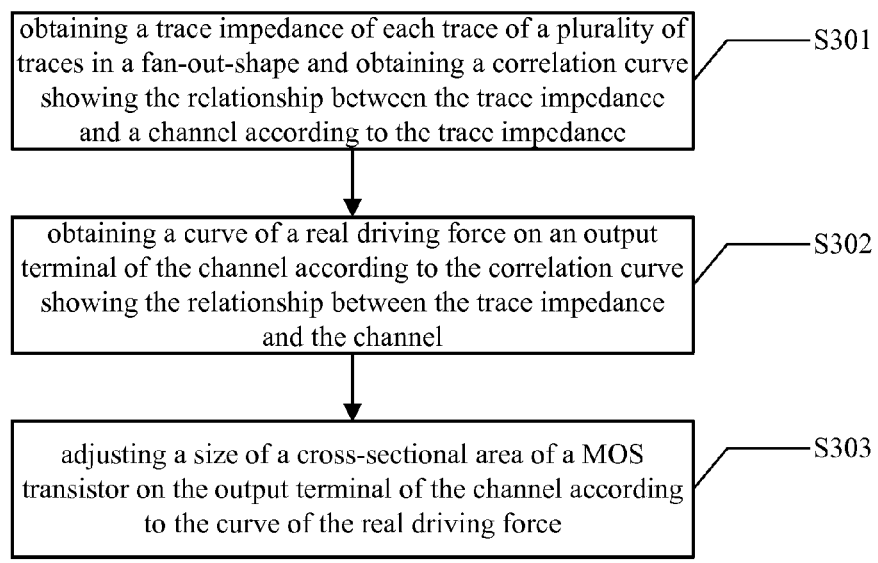
FIG. 3 is a flow chart showing a color cast compensation method for liquid crystal display panel provided by a first embodiment of the present invention.

FIG. 3 is a flow chart showing a color cast compensation method for liquid crystal display panel provided by a first embodiment of the present invention. The color cast compensation method for liquid crystal display panel provided by the embodiment of the present invention comprises:

Step S301: obtaining a trace impedance of each trace of a plurality of traces in a fan-out-shape and obtaining a correlation curve showing the relationship between the trace impedance and a channel according to the trace impedance;

wherein a specific process can be calculating the trace impedance of each trace according to the length and width of each trace, and obtaining the correlation curve showing the relationship between the trace impedance and the channel according to the trace impedance obtained by calculating mentioned above; wherein the liquid crystal display panel is a multiple film tri-gate transistor liquid crystal display panel.

Figure 5:
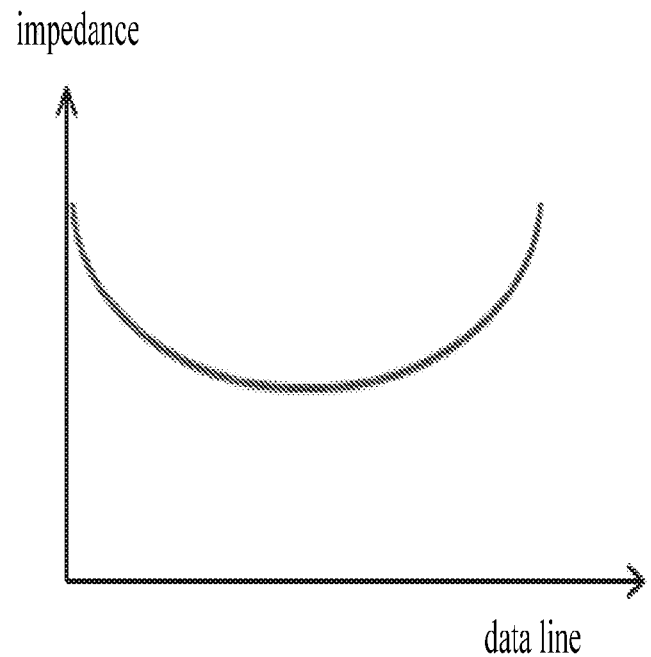
FIG. 5 shows a correlated curve corresponding to the relationship between impedance of traces and different positions of the traces in the liquid crystal display panel provided by the first and second embodiment of the present invention.

As shown in FIG. 5, the trace impedances of the data lines at different positions are different from each other. Each channel corresponds to a data line, which is used for transmitting a pixel charging voltage. Each RGB sub-pixel is charged by a corresponding data line. The trace impedances are different so that the pixel charging voltages corresponding to each of the traces in the same channel are different from each other.

Step S302: obtaining a curve of a real driving force on an output terminal of the channel according to the correlation curve showing the relationship between the trace impedance and the channel.

A specific process is to obtain an output voltage of each trace correlated to the channel according to the correlation curve showing the relationship between the trace impedance and the channel, and preset a preset driving force of the channel. Because the trace impedances are fixed after the liquid crystal display panel unit being designed and produced, the preset driving force is set in each channel of the IC chip existed nowadays to ensure the pixel charging voltage corresponding to each trace. The preset driving forces of all the traces are the same, and therefore the driving forces of some channels are insufficient due to different trace impedances.

Next, the preset driving force of the channel is determined whether making the output voltage of each trace correlated to the channel reach a predetermined pixel charging voltage.

If the result of the determination is yes, the real driving force is set to be the same as the preset driving force; otherwise, the preset driving force of the channel where the preset driving force does not make the output voltages of the traces correlated to the channel reach the predetermined pixel charging voltage is adjusted, such that the adjusted preset driving force of the channel makes output voltages of the traces correlated to the channel reach the predetermined pixel charging voltage, and the real driving force is set to be the same as the adjusted preset driving force.

Figure 6:
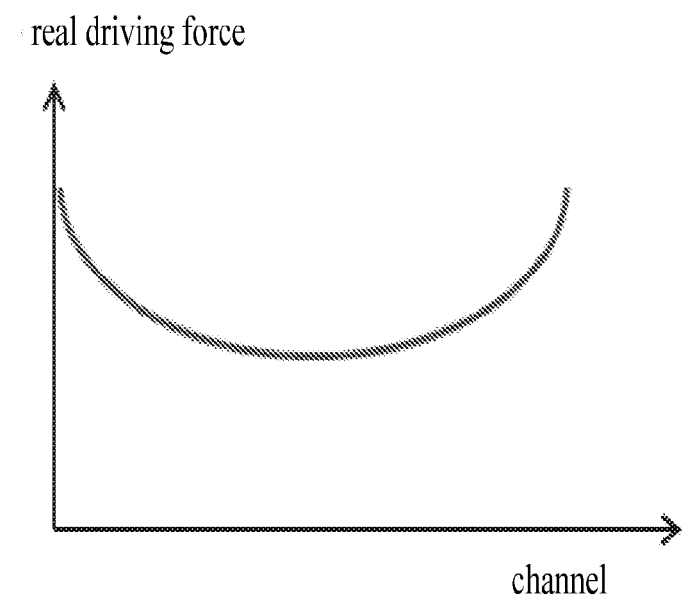
FIG. 6 shows a correlated curve corresponding to the relationship between real driving force and each channel in the IC chip provided by the first and second embodiment of the present invention.

The curve of the real driving force on the output terminal of the channel according to the real driving force set as above can be obtained accordingly and shown in FIG. 6, which shows a correlated curve corresponding to the relationship between real driving force and each channel in the IC chip.

Step S303: adjusting a size of a cross-sectional area of a MOS transistor on the output terminal of the channel according to the curve of the real driving force.

A specific process is to build a channel driving force buffer and adjusting the size of the cross-sectional area of the MOS transistor on the output terminal of the channel according to the curve of the real driving force, wherein the size of the cross-sectional area of the MOS transistor on the output terminal of the channel is proportional to the driving force of the channel.

Figure 1:
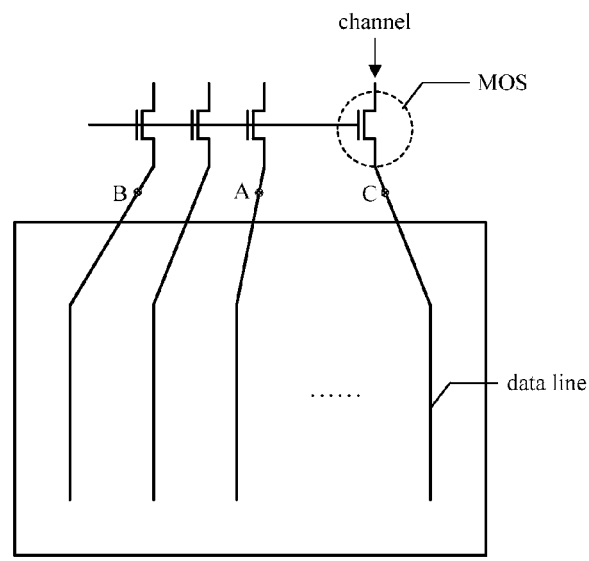
FIG. 1 is a diagram showing data curve corresponding to the voltage variation of the channels of the source side of the single film tri-gate transistor in a liquid crystal display panel in prior art.
Figure 2:
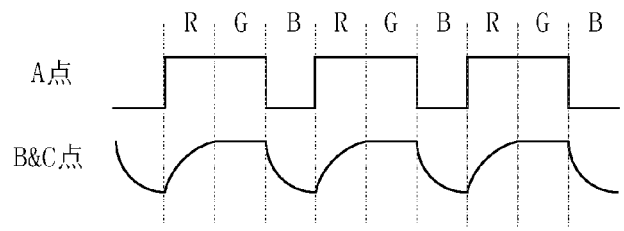
FIG. 2 shows a correlated curve corresponding to the relationship between the output voltage and the channels on three points A, B and C in FIG. 1.

When the size of the cross-sectional area of the MOS transistor becomes larger, the number of charges passes through per unit time becomes larger as well, and therefore the current passes through becomes larger. The driving force of the channel is therefore increased. When the size of the cross-sectional area of the MOS transistor becomes smaller, the data curve variation speed (such as the points B, C shown in FIG. 2) is affected so that the rising time and falling time becomes larger, too. The worst case would occur under the affection is that the pixel voltage reached is not the predetermined pixel voltage (such as the relationship between two points B, C and point A shown in FIG. 2), and therefore leads to color cast. To solve color cast, the area of the chip and cost would be increased if the cross-sectional areas of all the MOS transistors are increased to improve driving force of each of the channels in the IC chip. The embodiment obtains the real driving force of each of the channels and the cost can be reduced by adjusting the cross-sectional area of the MOS transistor on the output terminal of each channel when it is necessary according to the obtained curve of the real driving force on the output terminal of each channel.

Figure 4:
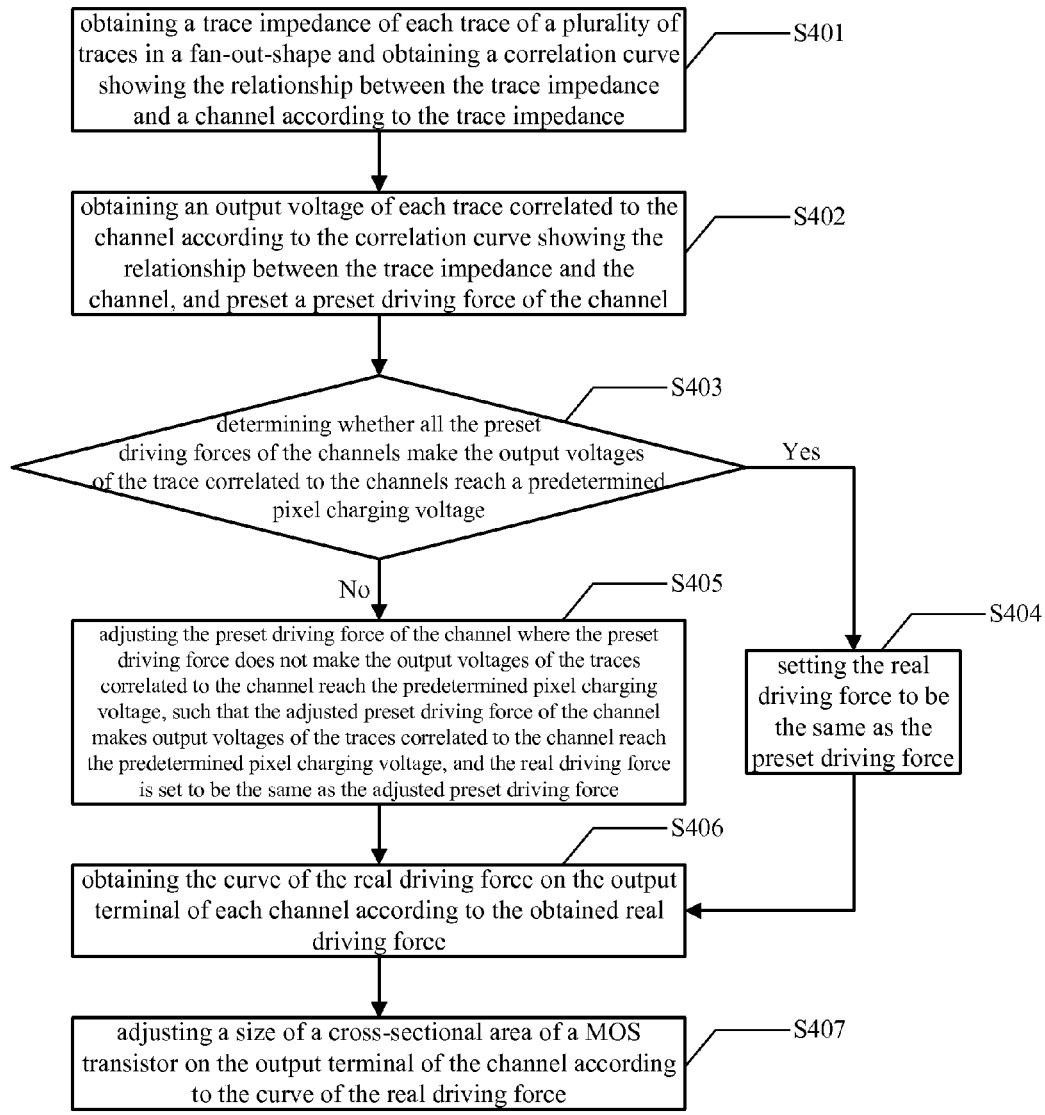
FIG. 4 is a flow chart showing a color cast compensation method for liquid crystal display panel provided by a second embodiment of the present invention.

FIG. 4 is a flow chart showing a color cast compensation method for liquid crystal display panel provided by a second embodiment of the present invention. The color cast compensation method for liquid crystal display panel provided by the embodiment of the present invention comprises:

Step S401: obtaining a trace impedance of each trace of a plurality of traces in a fan-out-shape and obtaining a correlation curve showing the relationship between the trace impedance and a channel according to the trace impedance;

wherein a specific process can be calculating the trace impedance of each trace according to the length and width of each trace, and obtaining the correlation curve showing the relationship between the trace impedance and the channel according to the trace impedance obtained by calculating mentioned above; wherein the liquid crystal display panel is a multiple film tri-gate transistor liquid crystal display panel.

As shown in FIG. 5, the trace impedances of the data lines at different positions are different from each other. Each channel corresponds to a data line, which is used for transmitting a pixel charging voltage. Each RGB sub-pixel is charged by a corresponding data line. The trace impedances are different so that the pixel charging voltages corresponding to each of the traces in the same channel are different from each other.

Step S402: obtaining an output voltage of each trace correlated to the channel according to the correlation curve showing the relationship between the trace impedance and the channel, and preset a preset driving force of the channel.

Because the trace impedances are fixed after the liquid crystal display panel unit being designed and produced, the preset driving force is set in each channel of the IC chip existed nowadays to ensure the pixel charging voltage corresponding to each trace. The preset driving forces of all the traces are the same, and therefore the driving forces of some channels are insufficient due to different trace impedances.

Step S403: determining whether all the preset driving forces of the channels make the output voltages of the traces correlated to the channels reach a predetermined pixel charging voltage. If yes, the Step S404 is performed; if no, the Step S405 is performed otherwise.

Step S404: setting the real driving force to be the same as the preset driving force. Step S406 is performed after obtaining the read driving force.

Step S405: adjusting the preset driving force of the channel where the preset driving force does not make the output voltages of the traces correlated to the channel reach the predetermined pixel charging voltage, such that the adjusted preset driving force of the channel makes output voltages of the traces correlated to the channel reach the predetermined pixel charging voltage, and the real driving force is set to be the same as the adjusted preset driving force. Step S406 is performed after obtaining the read driving force.

Step S406: obtaining the curve of the real driving force on the output terminal of each channel according to the obtained real driving force set as above. A correlated curve corresponding to the relationship between real driving force and each channel in the IC chip is shown in FIG. 6.

Step S407: adjusting a size of a cross-sectional area of a MOS transistor on the output terminal of the channel according to the curve of the real driving force.

A specific process is to build a channel driving force buffer and adjusting the size of the cross-sectional area of the MOS transistor on the output terminal of the channel according to the curve of the real driving force, wherein the size of the cross-sectional area of the MOS transistor on the output terminal of the channel is proportional to the driving force of the channel.

When the size of the cross-sectional area of the MOS transistor becomes larger, the number of charges passes through per unit time becomes larger as well, and therefore the current passes through becomes larger. The driving force of the channel is therefore increased. When the size of the cross-sectional area of the MOS transistor becomes smaller, the data curve variation speed (such as the points B, C shown in FIG. 2) is affected so that the rising time and falling time becomes larger, too. The worst case would occur under the affection is that the pixel voltage reached is not the predetermined pixel voltage (such as the relationship between two points B, C and point A shown in FIG. 2), and therefore leads to color cast. To solve color cast, the area of the chip and cost would be increased if the cross-sectional areas of all the MOS transistors are increased to improve driving force of each of the channels in the IC chip. The embodiment obtains the real driving force of each of the channels and the cost can be reduced by adjusting the cross-sectional area of the MOS transistor on the output terminal of each channel when it is necessary according to the obtained curve of the real driving force on the output terminal of each channel.

Figure 7:
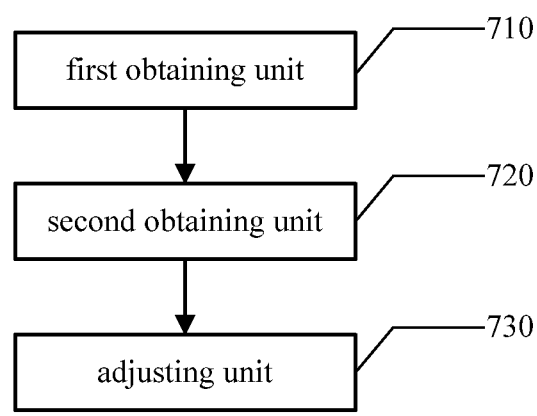
FIG. 7 is a structural schematic diagram showing a color cast compensation system for liquid crystal display panel provided by a third embodiment of the present invention.

Refer to FIG. 7, which show the embodiment of the color cast compensation system for liquid crystal display panel provided by the present invention.

FIG. 7 is a structural schematic diagram showing a color cast compensation system for liquid crystal display panel provided by a third embodiment of the present invention. The color cast compensation system for liquid crystal display panel provided by the embodiment of the present invention comprises:

a first obtaining unit 710, a second obtaining unit 720 and an adjusting unit 730, wherein the first obtaining unit 710 is used for obtaining a trace impedance of each trace of a plurality of traces in a fan-out-shape and obtaining a correlation curve showing the relationship between the trace impedance and a channel according to the trace impedance;

the second obtaining unit 720 is used for obtaining a curve of a real driving force on an output terminal of the channel according to the correlation curve showing the relationship between the trace impedance and the channel;

the adjusting unit 730 is used for adjusting a size of a cross-sectional area of a MOS transistor on the output terminal of the channel according to the curve of the real driving force.

In the embodiment of the present invention, the liquid crystal display panel in the color cast compensation system for liquid crystal display panel is a multiple film tri-gate transistor liquid crystal display panel; wherein the trace impedance of each trace in the system is calculated according to the length and width of each trace. The size of the cross-sectional area of the MOS transistor on the output terminal of the channel in the system is proportional to the driving force of the channel.

In an embodiment of the present invention, the color cast compensation system for liquid crystal display panel firstly obtains the trace impedance of each trace of a plurality of traces in the fan-out-shape, and obtains the correlation curve showing the relationship between the trace impedance and the channel according to the trace impedance in the first obtaining unit 710. Secondly, the second obtaining unit 720 obtains the curve of the real driving force needed on the output terminal of the channel according to the correlation curve showing the relationship between the trace impedance and the channel. Finally, the adjusting unit 730 adjusts the size of the cross-sectional area of the MOS transistor on the output terminal of the channel according to the curve of the real driving force.

Implement the embodiments of the present invention gives the benefit effects as below:

1. By designing driving force of each channel on source side of the transistor to be varied according to charging voltage of each trace for making the output voltage of each trace reach the pixel charging voltage, the problem of color cast caused by insufficient driving force in color blending grey frame displayed in the liquid crystal display panel is solved, and display quality is improved.

2. Because the designed driving force is proportional to the size of the cross-sectional area of the MOS transistor on the output terminal of the channel, the cross-sectional area becomes smaller while the driving force being designed to be smaller, and the cross-sectional area becomes larger while the driving force being designed to be larger. Accordingly, the size of the chip is greatly reduced and the design cost is lowered.

It should be noted that all the units in the embodiment of color cast compensation system is divided in accordance to function logic. However, the division is not limited to those described above. The only requirement is that the divided unit would provide corresponding function. Furthermore, the names of the function units are only intended for distinguishing themselves from each other.

Those with ordinary skill in the art should realize that all or some steps for accomplishing the method of the embodiment described above can be achieved by instructing related hardware through procedures. The procedures can be stored in a computer readable storage medium, such as ROM/RAM, magnetic disk, optical disk and so on.

Those disclosed above are only preferred embodiments according to the present invention and should not be used for limiting the scope of the invention. All the equivalent variations are considered within the scope of the invention.

What is claimed is:

1. A color cast compensation method for liquid crystal display panel, wherein the color cast compensation method comprises:

obtaining a trace impedance of each trace of a plurality of traces in a fan-out-shape and obtaining a correlation curve showing the relationship between the trace impedance and a channel according to the trace impedance, wherein the channel is used for driving the trace corresponding to the channel;

obtaining a curve of a real driving force on an output terminal of the channel according to the correlation curve showing the relationship between the trace impedance and the channel; and adjusting a size of a cross-sectional area of a MOS transistor on the output terminal of the channel according to the curve of the real driving force before manufacturing the MOS transistor, wherein the MOS transistor is disposed between the channel and the trace corresponding to the channel for transmitting signals from the channel to the trace corresponding to the channel, wherein, obtaining the curve of the real driving force on the output terminal of the channel according to the correlation curve showing the relationship between the trace impedance and the channel comprises the steps of:
  obtaining an output voltage of each trace correlated to the channel according to the correlation curve showing the relationship between the trace impedance and the channel, and presetting a reset driving force of the channel;
  determining whether the preset driving force of the channel makes the output voltage of each trace correlated to the channel reach a predetermined pixel charging voltage;
  when result of the determination is yes, the real driving force is set to be the same as the preset driving force; otherwise, the preset driving force of the channel where the preset driving force does not make the output voltage of the trace correlated to the channel reach the predetermined pixel charging voltage is adjusted, such that the adjusted preset driving force of the channel makes output voltage of the trace correlated to the channel reach the predetermined pixel charging voltage, and the real driving force is set to be the same as the adjusted preset driving force; and
  obtaining the curve of the real driving force on the output terminal of the channel according to the real driving force set as above.

2. The color cast compensation method according to claim 1, wherein the trace impedance of each trace is calculated according to the length and width of each trace.

3. The color cast compensation method according to claim 1, wherein adjusting the size of the cross-sectional area of the MOS transistor on the output terminal of the channel according to the curve of the real driving force comprises a step of:
  building a channel driving force buffer and adjusting the size of the cross-sectional area of the MOS transistor on the output terminal of the channel according to the curve of the real driving force.

4. The color cast compensation method according to claim 3, wherein the size of the cross-sectional area of the MOS transistor on the output terminal of the channel is proportional to the driving force of the channel.

5. The color cast compensation method according to claim 1, wherein the liquid crystal display panel is a multiple film tri-gate transistor liquid crystal display panel.

6. A color cast compensation method for liquid crystal display panel, wherein the color cast compensation method comprises:
  obtaining a trace impedance of each trace of a plurality of traces in a fan-out-shape and obtaining a correlation curve showing the relationship between the trace impedance and a channel according to the trace impedance, wherein the channel is used for driving the trace corresponding to the channel;
  obtaining an output voltage of each trace correlated to the channel according to the correlation curve showing the relationship between the trace impedance and the channel, and presetting a preset driving force of the channel;
  determining whether the preset driving force of the channel makes the output voltage of each trace correlated to the channel reach a predetermined pixel charging voltage;
  when result of the determination is yes, the real driving force is set to be the same as the preset driving force; otherwise, the preset driving force of the channel where the preset driving force does not make the output voltage of the trace correlated to the channel reach the predetermined pixel charging voltage is adjusted, such that the adjusted preset driving force of the channel makes output voltage of the trace correlated to the channel reach the predetermined pixel charging voltage, and the real driving force is set to be the same as the adjusted preset driving force;
  obtaining a curve of the real driving force on an output terminal of the channel according to the real driving force set as above; and
  adjusting a size of a cross-sectional area of a MOS transistor on the output terminal of the channel according to the curve of the real driving force before manufacturing the MOS transistor, wherein the MOS transistor is disposed between the channel and the trace corresponding to the channel for transmitting signals from the channel to the trace corresponding to the channel.

7. The color cast compensation method according to claim 6, wherein the trace impedance of each trace is calculated according to the length and width of each trace.

8. The color cast compensation method according to claim 6, wherein adjusting the size of the cross-sectional area of the MOS transistor on the output terminal of the channel according to the curve of the real driving force comprises a step of:
  building a channel driving force buffer and adjusting the size of the cross-sectional area of the MOS transistor on the output terminal of the channel according to the curve of the real driving force.

9. The color cast compensation method according to claim 8, wherein the size of the cross-sectional area of the MOS transistor on the output terminal of the channel is proportional to the driving force of the channel.

10. The color cast compensation method according to claim 6, wherein the liquid crystal display panel is a multiple film tri-gate transistor liquid crystal display panel.

* * * * *